United States Patent
Nguyen et al.

[19]

[11] Patent Number: 5,933,759
[45] Date of Patent: *Aug. 3, 1999

[54] METHOD OF CONTROLLING ETCH BIAS WITH A FIXED LITHOGRAPHY PATTERN FOR SUB-MICRON CRITICAL DIMENSION SHALLOW TRENCH APPLICATIONS

[75] Inventors: Phi L. Nguyen, Hillsboro; Ralph A. Schweinfurth, Beverton; Swaminathan Sivakumar, Hillsboro, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/778,020

[22] Filed: Dec. 31, 1996

[51] Int. Cl.$^6$ ............................ C03C 15/00; C03C 25/06
[52] U.S. Cl. ............................ 438/700; 216/59; 216/84
[58] Field of Search ............................ 156/625.1, 643.1, 156/646.1, 650.1, 654.1, 662.1; 216/59, 84; 438/700

[56] References Cited

U.S. PATENT DOCUMENTS 5,116,460  5/1992  Bukhman ............................ 156/643

FOREIGN PATENT DOCUMENTS 0 393 869  10/1990  European Pat. Off. .
0 495 524   7/1992  European Pat. Off. .
0 721 205   7/1996  European Pat. Off. .

Primary Examiner—Lynette F. Smith
Assistant Examiner—Brenda G. Brumback
Attorney, Agent, or Firm—Blakely, Sokoloff, Taylor & Zafman LLP

[57] ABSTRACT

The present invention describes a method for forming sub-micron critical dimension shallow trenches with improved etch selectivity and etch bias control. In one embodiment of the present invention, three separate etch steps are performed. A polish stop layer (or an etch hard mask layer) and an oxide layer are etched during the first and second etch steps and the underlying substrate is etched during the third etch step. In the first etch step a carbon-fluorine based etchant is used in order to form a polymer layer along the photoresist, polish stop layer (or etch hard mask layer), and oxide layer. After the first etch step, a second etch step is used to remove the polymer from the horizontal surfaces of the semiconductor structures thereby forming polymer sidewalls as well as completing the etching of the polish stop layer (or etch hard mask layer) and the oxide layer. Polymer sidewalls protect the photoresist, polish stop layer (or etch hard mask layer), and oxide layer during the third etch step thereby improving the etch selectivity and etch bias control. The third etch step completes the formation of the trench by etching the substrate.

33 Claims, 5 Drawing Sheets

METHOD OF CONTROLLING ETCH BIAS WITH A FIXED LITHOGRAPHY PATTERN FOR SUB-MICRON CRITICAL DIMENSION SHALLOW TRENCH APPLICATIONS

BACKGROUND OF THE INVENTION

1. Field of the Invention

This invention relates to the field of semiconductor devices, and more specifically, to a process for controlling the etch bias during the formation of trenches with sub-micron dimensions.

2. Background Information

As semiconductor devices shrink ever smaller, so must its circuitry (components) such as trenches, contacts, plugs, vias, and interconnect lines. For example, in the current generation of semiconductor devices, the density of the circuitry (components) have become so compact that the dimensions of these components have decreased below submicron dimensions ($\leq 1$ micron).

A consequence of the smaller devices and the increasing density of the components on these devices is that it becomes increasingly more important to control the critical dimensions of these components. As the dimensions for these components become even smaller and spaced relatively closer, for example, less than 0.5 micron ($<0.5\mu$) and even less than 0.25 micron ($<0.25\mu$), the processes used to make such components become less reliable and are unable to control the critical dimensions (CDs) of such components. If the critical dimensions of such components are not controlled, some of the components may be shorted together and consequently the semiconductor device being fabricated may not function properly.

In order to control the critical dimensions of these components, the processes used to manufacture these components should have good etch selectivity (to photoresists, metals, etc.) and exhibit good control over the etch bias. Prior art processes have the ability to control the critical dimensions within acceptable tolerance ranges for components with dimensions greater than approximately 1 micron ($>1\mu$). However, as the dimensions decrease below this level, i.e. at or below $1\mu$, these processes do not provide sufficient control over the critical dimensions due to poor etch selectivity and etch bias control.

Etch selectivity is the ratio of the etch rates of different materials. For example, the etch selectivity for forming a trench may be the ratio of the etch rate of an silicon layer to a nitride layer (silicon: nitride). Etch bias is the difference between what is printed and what is actually formed after etching. For example, a photoresist prints a $1.0\mu$ trench, but after etching a $1.25\mu$ trench is actually formed, this is an example of a positive etch bias. Thus, a process with poor etch bias control may not be able to maintain the requisite critical dimensions for current and/or future generations of semiconductor devices.

FIGS. 1a–1c illustrate the generic or well known process steps for photolithographic and masking techniques used to form trenches. It should be noted that the figures are merely illustrative and have been simplified for clarity purposes and that similar processes may be used to form more complex structures. FIG. 1a illustrates a substrate 100 with an oxide layer 110 and a polish stop layer (or an etch hard mask layer) 120 deposited thereon. In FIG. 1b, a photoresist layer 130 has been spun above polish stop layer (or an etch hard mask layer) 120 and is exposed to light through mask layer 140. After photoresist layer 130 has been exposed to light, mask layer 140 is removed and photoresist layer 130 is developed in a developing solution to remove the portions of the photoresist layer 130 that were exposed to light. FIG. 1c illustrates photoresist layer 130 after the soluble portions of photoresist layer 130 have been removed. It should be noted that, although the above description describes positive resist techniques, it will be obvious to one with ordinary skill in the art, that negative resist techniques may also be used to pattern trenches.

Once the soluble portions of photoresist layer 130 have been removed, polish stop layer (or etch hard mask layer) 120, oxide layer 110, and substrate 100 are etched to form an opening 150, in order to create a trench. The particular etch chemistry and process parameters used, not only determine the amount of control over the critical dimensions, such as width and length, but also control the etch selectivity (to photoresists, metals, etc.) and the etch bias when forming a trench.

As illustrated in FIG. 1d, prior art processes are unable to control the critical dimensions of opening 150. The sidewalls of opening 150, as shown in FIG. 1d are not vertical and slope outward at the top of the opening. This is due in large part to poor etch selectivity and poor etch bias control. Photoresist layer 130 is removed after the formation of opening 150, however, it is illustrated in FIG. 1d by a dashed line to illustrate the difference between the printed CD and the resultant CD. As shown in FIG. 1d, because the resultant trench (i.e. opening 150) is larger than the pattern printed by photoresist layer 130 there is a positive etch bias. For packing densities and electrical integrity, it is ideal to be able to control the etch bias in order to keep the final CD the same as the printed CD. However, typical prior art etch processes only have the ability to form trenches that have a positive etch bias.

Since prior art processes typically form trenches with a positive etch bias, there is a greater importance placed upon the photolithography process which prints the desired critical dimensions. In other words, prior art processes print at smaller dimensions than the desired critical dimensions. For example, if a trench formation process exhibits a positive etch bias of approximately $0.05\mu$, then in order to get a $0.25\mu$ trench, the lithography method must print at approximately $0.2\mu$. However, as dimensions start to shrink the lithography processes are very limited in how small the dimensions can be printed. Thus, if the trench formation process had good etch bias control, one could print at or about the same size/dimensions of the critical dimension desired.

Another problem with prior art trench processes is that the type of etch chemistries which are used in order to have a manufacturable process form a buildup in the etching chamber. After etching several wafers the chamber becomes dirty due to this buildup and must be cleaned before manufacturing can continue. Thus, the faster the chamber gets dirty the more the manufacturing process is slowed down, which means fewer wafers are processed in a greater amount of time.

Thus what is needed is a method for forming trenches with improved etch selectivity and improved etch bias control such that smaller and more dense semiconductor devices may be fabricated and still exhibit good electrical performance. It is also preferable that this method improves the throughput of the fabrication process by increasing the time between etch chamber cleaning.

SUMMARY OF THE INVENTION

The present invention describes a method for forming sub-micron trenches with improved etch selectivity and etch bias control while increasing fabrication throughput. One embodiment of the present invention forms a trench by performing a first etch step using a carbon-based etchant in order to etch a polish stop layer (or an etch hard mask layer) and an oxide layer. After the first etch step, a second etch step is used to remove the polymer from the horizontal surfaces of the semiconductor structures thereby forming polymer sidewalls as well as completing the etching of the polish stop layer (or etch hard mask layer) and the oxide layer. A third etch step is performed in order to etch the substrate underlying the polish stop or etch hard mask and oxide layers, thereby completing the trench.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method of controlling etch bias with a fixed lithography pattern for sub-micron critical dimension shallow trench applications is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for forming sub-micron shallow trenches with improved etch selectivity and etch bias control. In the manufacture of semiconductor devices, and more specifically when forming trenches, the present invention is employed to control the critical dimensions of the opening thus allowing the trenches to be spaced relatively close together without degrading the electrical performance of the semiconductor device.

When forming a semiconductor device, circuits often need to be formed to be electrically isolated from one device to another device or devices. One method for forming these circuit isolation regions is to form trenches or openings in the substrate overlying, underlying, adjoining, etc. the devices which are to be isolated. These openings are then filled with a non-conductive material to form an isolation trench. In one embodiment of the present invention, for example, the trenches are formed in a trilayer structure that is made of an oxide layer grown above a substrate with a polish stop or an etch hard mask layer deposited above the oxide layer. It should be noted and it will be obvious to one with ordinary skill in the art that other structures and materials may be used in which to form trenches.

Figure 1A:
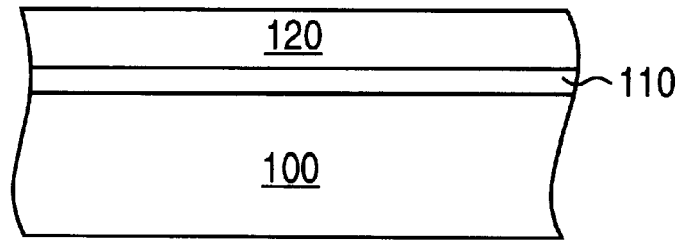
FIG. 1a illustrates a cross-sectional view of a substrate with an oxide layer and a polish stop layer deposited thereon.
Figure 1B:
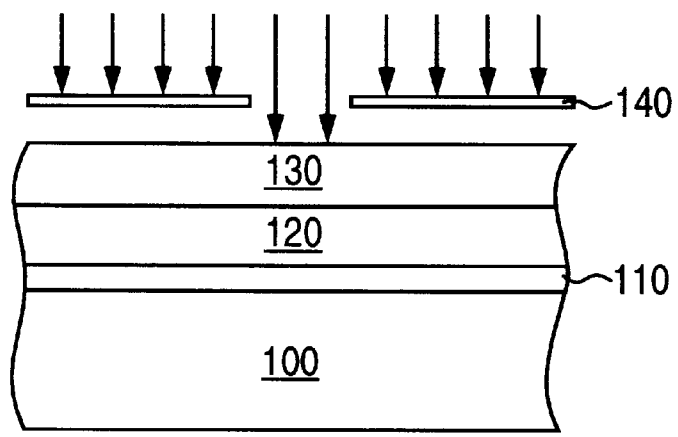
FIG. 1b illustrates a cross-sectional view of a mask and a photoresist layer coated on the polish stop layer of FIG. 1a during exposure to light.
Figure 1C:
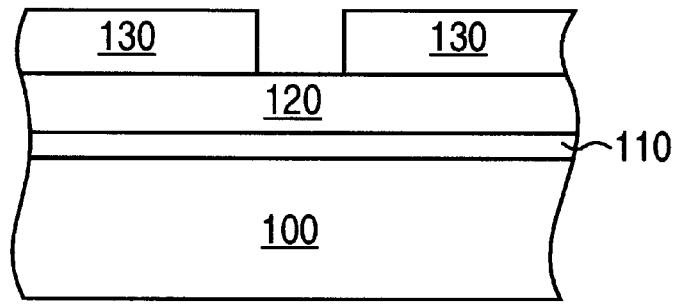
FIG. 1c illustrates a cross-sectional view of the photoresist layer of FIG. 1b after patterning.
Figure 1D:
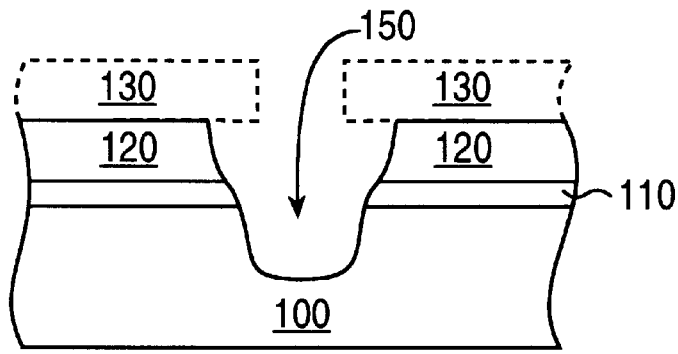
FIG. 1d illustrates a cross-sectional view of the structure of FIG. 1c after etching using prior art processes.

A trench is formed by etching an opening into the structure. It should be noted, and it will be obvious to one with ordinary skill in the art, that the photolithographic and masking steps used to form a trench are well known in the art and are therefore not described in detail. A general example of such processes has been discussed above in the background of the invention and is illustrated in FIGS. 1a–1c. It should also be noted that the photolithographic processes and masking steps, as illustrated in FIGS. 1a–1c, are used with respect to the present invention but are not repeated or shown in the following detailed description of FIGS. 2a–2i.

Figure 3:
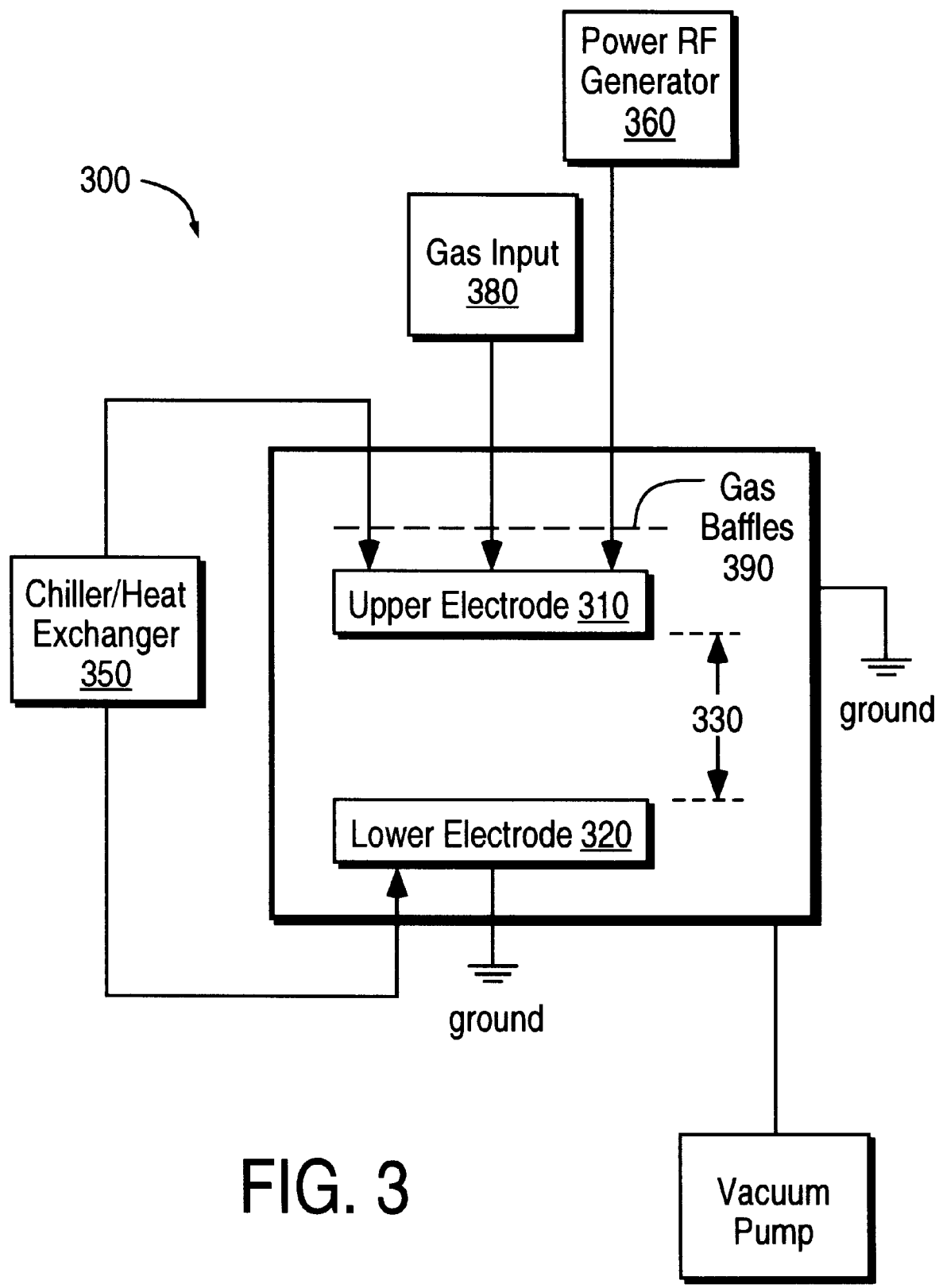
FIG. 3 illustrates a schematic of one embodiment of a low density parallel plate etch reactor.
Figure 4:
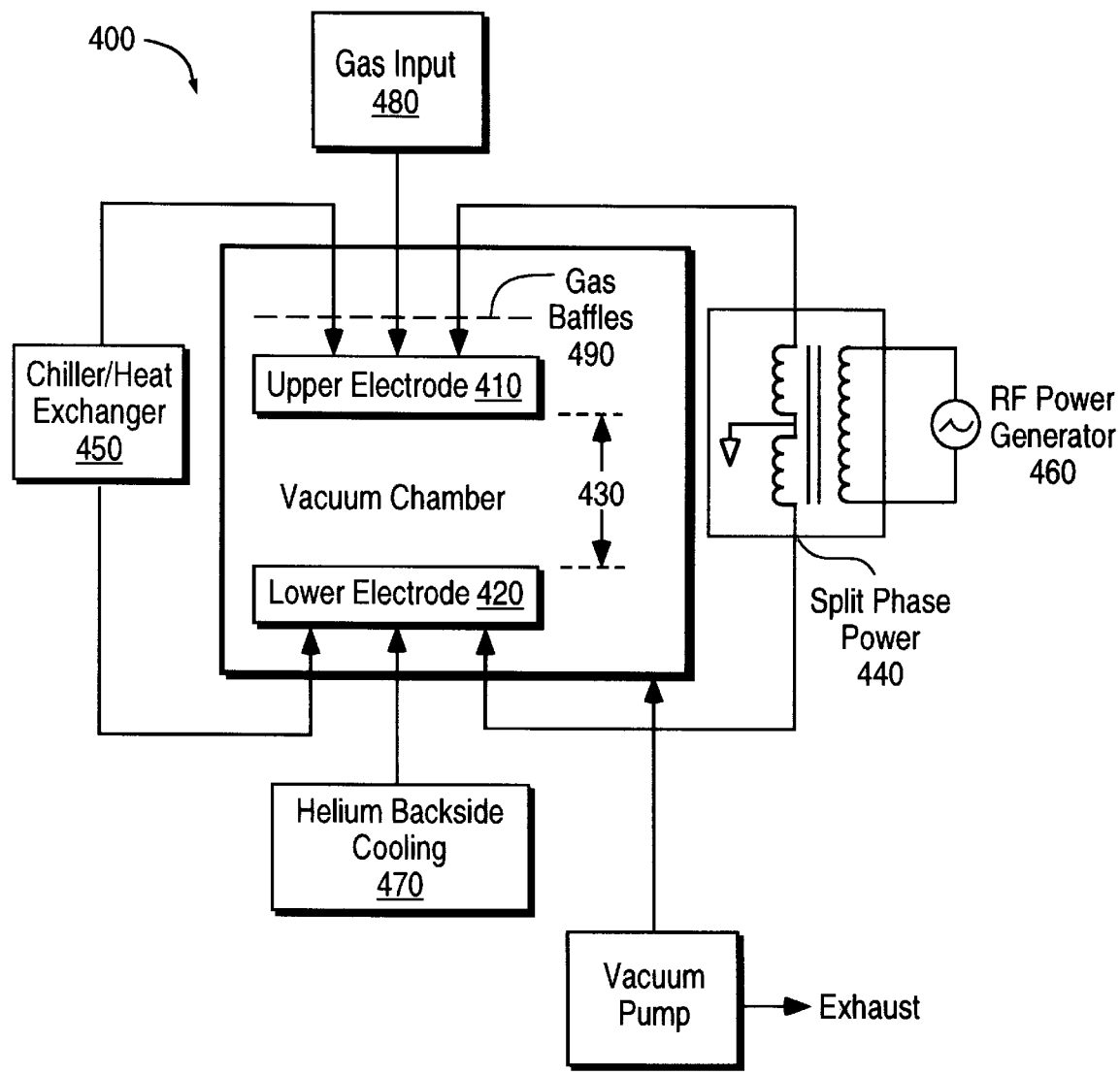
FIG. 4 illustrates a schematic of another embodiment of a low density parallel slate etch reactor.

The formation of sub-micron shallow trenches with improved etch selectivity and etch bias control requires an improved etch process and recipe for etching the layers in which the trench is formed. The present invention performs the etch process in three steps. All three steps are performed in a low density parallel plate etch reactors. In one embodiment the first and third etch steps are performed in one etch reactor and the second etch step is performed in another etch reactor. For example, in one preferred embodiment the first and third etch steps are performed in the Rainbow 4400 Oxide Etcher (Rainbow 4400) and the second etch step is performed in the Rainbow 4500 Oxide Etcher (Rainbow 4500) available from LAM Research Corporation, in San Jose, Calif. A schematic of a Rainbow 4400 Oxide Etcher is illustrated in FIG. 3. A schematic of a Rainbow 4500 Oxide Etcher is illustrated in FIG. 4. Although the present invention is described below with reference to the Rainbow 4400 and Rainbow 4500 it will be obvious to one with ordinary skill in the art that the present invention may be practiced using other similar reactors. For example, the second etch step may be performed using other oxide etchers such as the Applied Materials Centura Etcher, Tokyo Electron Limited Etcher 8500 DRM, and Tegal Oxide Etchter.

Figure 2A:
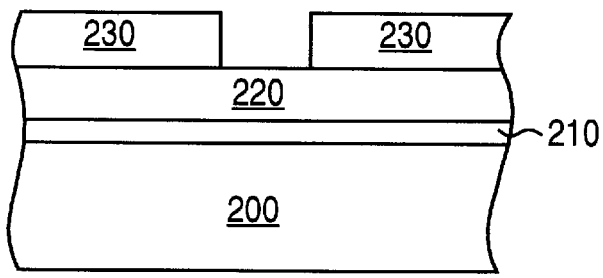
FIG. 2a illustrates a cross-sectional view of a substrate with an oxide layer, a polish stop layer (or etch hard mask layer), and a patterned photoresist deposited thereon.

FIG. 2a illustrates a substrate 200 with an oxide layer 210 and a polish stop layer (or etch hard mask layer) 220 deposited thereon. Also illustrated in FIG. 2a is a photoresist layer 230 which has been patterned to print a trench having sub-micron dimensions. In one embodiment substrate 200 may be made of silicon or polysilicon. Oxide layer 210 may be made of a sacrificial oxide, for example silicon dioxide. Polish stop layer 220, which may be used alternatively as an etch hard mask 220, may be made of a nitride, for example silicon nitride. It should be noted and it will be obvious to one with ordinary skill in the art, that the structure illustrated in FIGS. 2a–2i may be made of other materials, layers, etc.

In the present invention, three separate etch steps are performed in order to improve the etch selectivity and etch bias control in the formation of sub-micron trenches. The first etch step begins the etch process of the polish stop layer (or etch hard mask layer) 220 and the oxide layer 210 and the second etch step completes the etching of the polish stop layer 220 and the oxide layer 210. In addition, the second etch step is used as a cleaning/preparation process do accommodate the third etch step. The substrate 200 is then etched during the third etch step.

In the first etch step a carbon-fluorine based etchant is used in order to form polymer sidewalls along the photoresist, polish stop layer, and oxide layer sidewalls. However, polymer will form even on the flat surface of the trench opening during the first etch step. A high RF powered second etch step is then used in the present invention in order to sputter away the polymer on the flat (or horizontal) surfaces of the trench opening, while leaving behind the polymer on the sidewalls of the photoresist, polish stop layer/etch hard mask and oxide layers. The second step is also used to complete the etching of the polish stop layer/etch hard mask and oxide layer. Polymer sidewalls protect the photoresist, polish stop layer, and oxide layer during the third etch step thereby improving the etch selectivity and etch bias control.

Figure 2B:
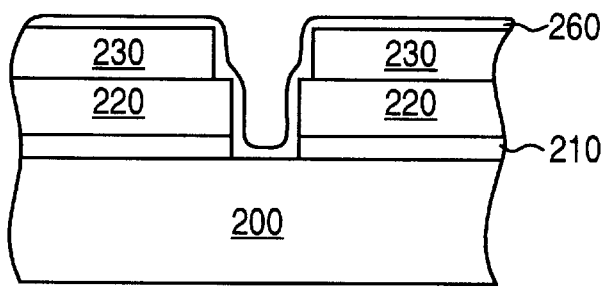
FIG. 2b illustrates a cross-sectional view of the structure in FIG. 2a during a first etch step of one embodiment of the present invention.

FIG. 2b illustrates the first etch step of the present invention wherein polish stop layer (or etch hard mask layer) 220 and oxide layer 210 are etched. As shown in FIG. 2b, the carbon-fluorine based etchant deposits a polymer layer 260 on the surface and sidewalls of the semiconductor structure during the first etch step. Polymer layer 260 is formed during the first etch step due to the carbon-fluorine based etch chemistry used in the present invention. Carbon-fluorine based etchants react to form a polymer which is deposited on the surfaces and sidewalls of the semiconductor structure being etched and also is deposited upon the surfaces of the etch reactor. One embodiment of the present invention uses $C_2F_6$ as the carbon-fluorine based etchant in the first etch step.

Figure 2C:
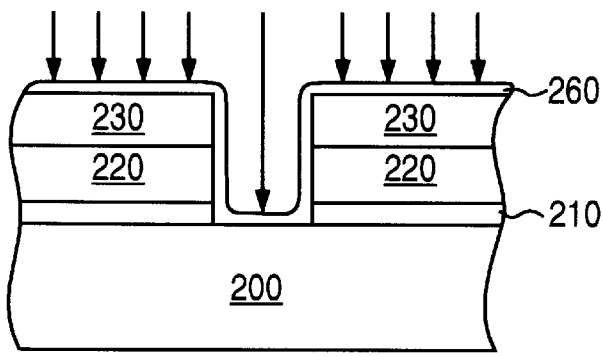
FIG. 2c illustrates a cross-sectional view of the structure in FIG. 2a during a second etch step of one embodiment of the present invention.

Because the polymer is formed on the surfaces and sidewalls of the semiconductor structure being etched, the present invention uses a second etch step that utilizes an etch reactor with a forward power in the range of approximately 1000–1900 watts, to complete the etching of the polish stop/etch hard mask layers and the oxide layer in addition to removing the polymer that is formed on the flat/horizontal surfaces of the semiconductor structures. Using an etch reactor at such a power level causes ion bombardment during the etch process, as is shown in FIG. 2c. Ion bombardment removes the polymer from the horizontal surfaces of semiconductor structure, but does not remove the polymer which has been formed on the vertical surfaces (i.e. sidewalls) of the semiconductor structure. One embodiment of the present invention uses the Rainbow 4500 which has the capability of running at a forward power at or greater than 1000 watts (≧1000 watts).

It should be noted and it will be obvious to one with ordinary skill in the art, that etch reactors which operate at less than 1000 watts do not provide effective ion bombardment of the surface and therefore would not effectively remove the polymer from the horizontal surfaces of the semiconductor structure. If the polymer is not effectively removed from the horizontal surfaces of the semiconductor structure, when performing the third etch step the bottom of the trench may be formed with a rough surface. A rough surface at the bottom of the trench can cause nonuniformity in the filling process. For example, when filling the trench to form the isolation region, gaps (or holes) may be formed at the bottom of the trench due to the rough surface. Such gaps may trap moisture and/or contaminants which may degrade device performance and reliability. Therefore, it is important that the polymer be removed from everywhere but the sidewalls of the trench being formed.

Figure 2D:
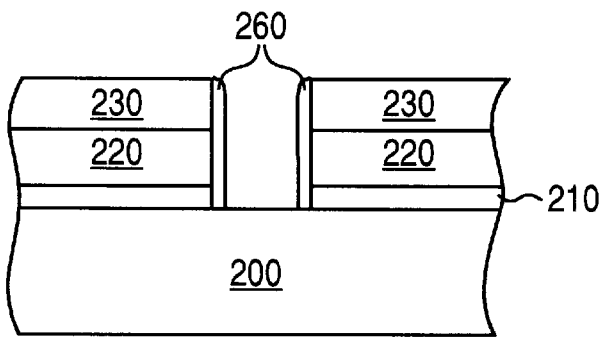
FIG. 2d illustrates a cross-sectional view of the structure in FIG. 2c after the second etch step of one embodiment of the present invention.

As shown in FIG. 2d polymer sidewalls 260 are formed along the sidewalls of photoresist layer 230, polish stop layer 220 and oxide layer 210. The formation of the polymer sidewalls 260 in the present invention improves the photoresist selectivity and etch bias control during the third etch step. The high photoresist selectivity and sidewall protection from the first and second etch steps then allows a standard non carbon-fluorine etchant to etch the substrate and finish the trench without inducing additional etch bias. In the third etch step, a non carbon-fluorine based etchant is used. Non carbon-fluorine based etchants do not form polymer deposits and therefore the surfaces of the semiconductor structure and the surfaces of the etch reactor are not subjected to polymer buildup. In one embodiment of the present invention a chlorine ($Cl_2$) based etchant is used during the third etch step.

Figure 2E:
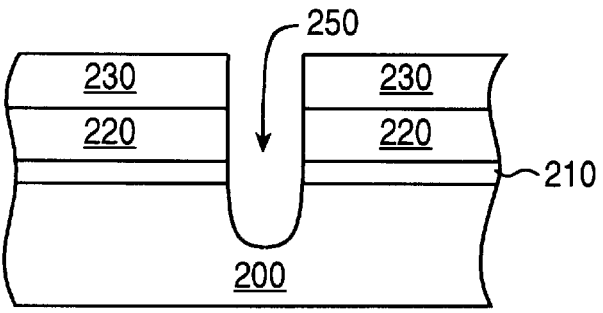
FIG. 2e illustrates a cross-sectional view of the structure in FIG. 2d after a third etch step of one embodiment of the present invention.

The non carbon-fluorine based etchant used in the third etch step etches the substrate 200 to form a shallow trench (or opening) 250, as illustrated in FIG. 2e. Polymer sidewalls 260 formed in the first and second etch steps, protect the sidewalls of the polish stop layer (or etch hard mask layer) 220 and oxide layer 210 from the etchant used in the third etch step. During the third etch step, the non carbon-fluorine based etchant etches substrate 200 and also etches the polymer sidewalls 260. It should be noted and it will be obvious to one with ordinary skill in the art, that the etchant used in the third etch step should be selected such that it has a higher etch selectivity to the substrate 200, such that the polymer sidewalls 260 will etch at a slower rate than substrate 200. One embodiment of the present invention uses the Rainbow 4400 for the third etch step.

Figure 2F:
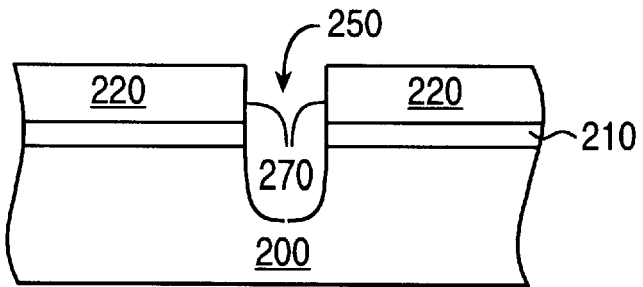
FIG. 2f illustrates a cross-sectional view of a trench formed using one embodiment of the present invention.

FIG. 2f illustrates the completed submicron shallow trench 250 after the photoresist layer 230 has been removed. As shown in FIG. 2e, the polymer sidewalls 260 were removed during the third etch step and the sidewalls 270 of polish stop layer (or etch hard mask layer) 220 and oxide layer 210 are substantially vertical. Thus, the polish stop layer (or etch hard mask layer) 220 and oxide layer 210 were protected during the third etch step which improved the etch bias control and maintained the critical dimensions of the printed photoresist.

Figure 2G:
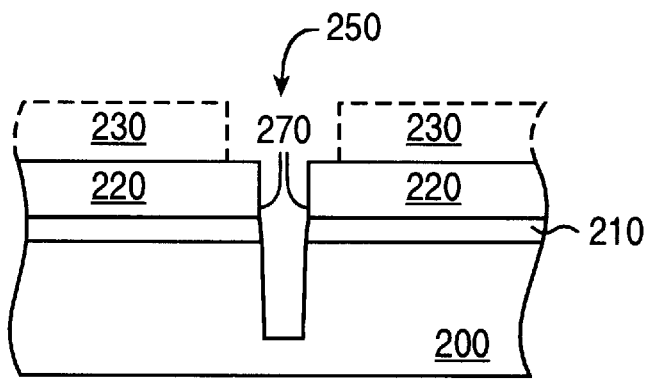
FIG. 2g illustrates a cross-sectional view of a trench having a negative etch bias formed using one embodiment of the present invention.
Figure 2H:
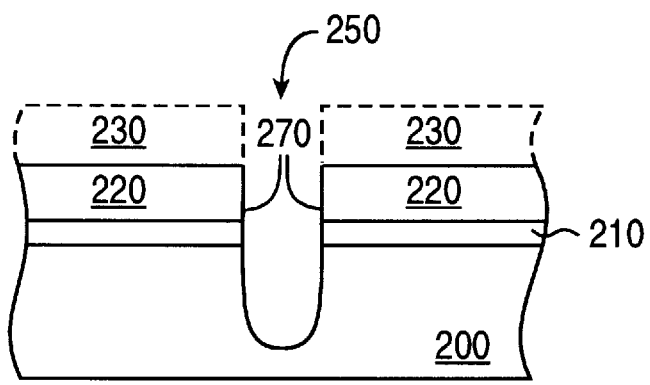
FIG. 2h illustrates a cross-sectional view of a trench having a zero etch bias formed using one embodiment of the present invention.
Figure 2I:
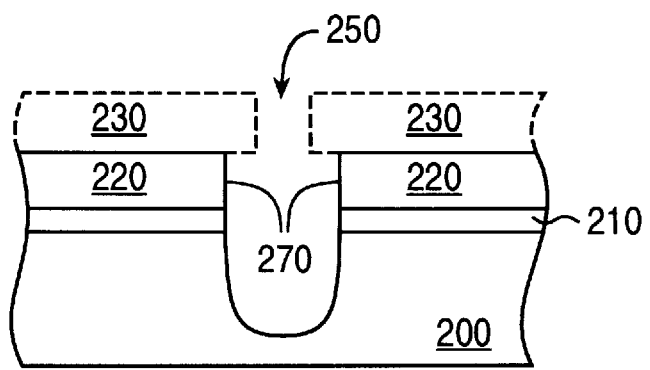
FIG. 2i illustrates a cross-sectional view of a trench having a positive etch bias formed using one embodiment of the present invention.

The recipe of the first and second etch steps of the present invention allows the main etchant gas, $C_2F_6$, in the first etch step, and $CF_4$ in the second etch step, to be more selective to the photoresist and provide a carbon-fluorine based polymer for sidewall protection required to vary the etch bias of the shallow trench etch process. The level of resist selectivity and sidewall protection is directly proportional to the amount of $C_2F_6$ and $CF_4$. Therefore, the level of photoresist selectivity and sidewall protection can be controlled using the present invention such that the etch bias can be varied from positive to negative. In other words, if thicker polymer sidewalls are formed the trench may be formed with a negative etch bias, as illustrated in FIG. 2g. If medium polymer sidewalls are formed, the trench may be formed with a zero etch bias, as illustrated in FIG. 2h. If thinner polymer sidewalls are formed, the trench may be formed with a positive etch bias, as illustrated in FIG. 2i.

The thickness of the polymer walls formed depends in large part upon the process recipe used during the first and second etch steps of the present invention. As stated earlier, FIG. 3 illustrates a low density parallel plate reactor 300 that may be used for the first etch step of the present invention. In one embodiment of the present invention the power of the reactor used in the first etch step is in the range of approximately 300–1000 watts. Such a power range effectively etches the polish stop layer/etch hard mask layer and the oxide layer as well as promoting polymer formation on all surfaces of the semiconductor structure. Upper electrode 310 and lower electrode 320 operate in the present invention with a gap spacing 330 in the range of approximately 0.6 to 1.0 cm. The electrode temperatures are maintained at a temperature in the range of approximately 10–20° C. while etching the polish stop layer and oxide layer using chillier/heat exchanger 350. RF power generator 360 operates at an RF frequency in the range of approximately 200 kilohertz (kHz) to 13.56 megahertz (MHz).

In the present invention, the first etch step is performed at a pressure in the range of approximately 300–700 mTorr. The etch chemistry of the present invention is delivered to the reactor 300 through gas input 380 and gas baffles 390. The polish stop layer/etch hard mask layer and the oxide layer are etched using carbon-fluorine based etchants, for example $C_2F_6$. In one embodiment of the present invention the $C_2F_6$ gas is delivered to the reactor along with an inert gas, helium, at a $C_2F_6$:He gas flow ratio in the range of approximately 1:1 to 8:1, respectively.

As stated earlier, FIG. 4 illustrates a low density parallel plate reactor 400 that may be used for the second etch step of the present invention. In one embodiment of the present invention the power of the reactor used in the second etch step is in the range of approximately 1000–1900 watts. Such a power range causes ion bombardment and removes polymer formation from the horizontal surfaces of the semiconductor structure. Upper electrode 410 and lower electrode 420 operate in the present invention with a gap spacing 430 in the range of approximately 1–1.2 cm. The electrode temperatures are maintained at a temperature in the range of approximately 0.1–20° C. while etching the polish stop layer and oxide layer using chiller/heat exchanger 450. RF power generator 460 operates at an RF frequency in the range of approximately 200 kilohertz (kHz) to 13.56 megahertz (MHz).

In the present invention, the second etch step is performed at a pressure in the range of approximately 300–700 mTorr with a helium backside cooling (470) pressure in the range of approximately 10–17 Torr. It should be noted that helium backside cooling is a process for cooling the backside of a wafer (or substrate) wherein helium is pumped into the gap between the wafer and lower electrode 420, thus cooling the backside of the wafer. The etch chemistry of the present invention is delivered to the reactor 400 through gas input 480 and gas baffles 490. Nitrogen gas and argon gas are delivered at a gas flow in the range of approximately 70–100 sccm and 300–500 sccm, respectively. The trench is etched using carbon-fluorine based etchants, for example $CF_4$. In one embodiment of the present invention the $CF_4$ gas is delivered to the reactor at a gas flow in the range of approximately 70–100 sccm.

A $C_2F_6$:He gas flow ratio in the range of approximately 0.1:1–8:1 during the first etch step and $CF_4$ gas flow in the range of approximately 70–100 sccm during the second etch step will vary the etch bias from negative to positive. In other words, the critical dimensions of the trench may be varied depending upon the $C_2F_6$:He and $CF_4$ gas flows used. Thus, by varying the etch chemistry the present invention can change the critical dimensions without having to change the lithography process. In a more specific embodiment of the present invention wherein it is desired to have a zero etch bias the $C_2F_6$:He ratio is in the range of approximately 0.5:1 to 0.7:1.

The third etch step may also be performed using an etch reactor such as the one illustrated in FIG. 3. The particular etch process used in the third etch step to etch substrate 200 will depend upon the material that makes up substrate 200. It will be obvious to one with ordinary skill in the art, that the third etch step of the present invention may use etch processes that are well-known in the art for the particular material being used. For example, $NF_3$ gas or $Cl_2$ gas may be used to etch a silicon substrate in the third etch step.

The present invention enables the formation of trenches with critical dimensions $\leq 1$ $\mu$m, and aspect ratios (depth:width)$\geq 2:1$, with a photoresist selectivity$\geq 15:1$ and an etch bias in the range of approximately −0.05 to +0.05 $\mu$m. Due to the improved etch selectivity and etch bias control of the present invention, the critical dimensions of trench 250 are controllable to submicron dimensions with good electrical reliability.

Also, since the present invention only uses a carbon-fluorine based etchant in a portion of the etch process, i.e. the first and second etch steps, the total amount of polymer buildup in the etchant reactor is decreased. Additionally, since one embodiment of the present invention performs the first etch in one etch reactor and the second etch in a second etch reactor, the amount of polymer buildup in each reactor is minimized. Therefore, larger numbers of wafers may be etched before having to clean the reactor, thereby increasing the throughput of the reactor(s) as well as decreasing the downtime and costs for maintaining the reactor(s).

Thus, a method of controlling etch bias with a fixed lithography pattern for sub-micron critical dimension shallow trench applications has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for forming trenches in a substrate of a semiconductor device comprising:

performing a first etch step using a first carbon-fluorine base etchant, wherein said first etch step begins etching a polish stop layer and an oxide layer, wherein said polish stop layer is above said oxide layer, and wherein said first etch step forms a polymer layer on the exposed surfaces of said polish stop layer and said oxide layer;

performing a second etch step using a second carbon-fluorine base etchant, wherein said second etch step removes said polymer layer from the horizontal surfaces of said semiconductor device and completes the etching of said polish stop layer and said oxide layer; and performing a third etch step, wherein said third etch step etches said substrate.

2. The method as described in claim 1 wherein said substrate is selected from the group consisting of silicon and polysilicon.

3. The method as described in claim 1 wherein said polish stop layer comprises silicon nitride.

4. The method as described in claim 1 wherein said first and third etch steps are performed in a first low density parallel plate etch reactor and said second etch step is performed in a second low density parallel plate reactor.

5. The method as described in claim 1 wherein said first and second etch steps form a polymer protectant on the sidewalls of said trench being formed in said polish stop layer and said oxide layer during said first and second etch steps.

6. The method as described in claim 1 wherein said first carbon-fluorine base etchant comprises a $C_2F_6$:He gas.

7. The method as described in claim 1 wherein said second carbon-fluorine base etchant comprises a $CF_4$ gas.

8. The method as described in claim 6 wherein said $C_2F_6$:He gas is delivered at a gas flow ratio in the range of approximately 0.1:1–8:1, respectively.

9. The method as described in claim 7 wherein said $CF_4$ gas is delivered at a gas flow in the range of approximately 70–100 sccm.

10. The method as described in claim 7 wherein said first etch step is performed at:
   a forward power of approximately 300–1000 watts;
   an RF frequency in the range of approximately 200 kHz–13.56 MHz;
   a pressure in the range of approximately 300–700 mTorr;
   a gap spacing in the range of approximately 0.6–1.0 cm; and
   an electrode temperature in the range of approximately 0.1–20° C.

11. The method as described in claim 9 wherein said second etch step is performed with:
   a forward power of approximately 1000–1900 watts;
   an RF frequency in the range of approximately 200 kHz–13.56 MHz;
   a pressure in the range of approximately 300–700 mTorr;
   a gap spacing in the range of approximately 1–1.2 cm;
   an argon gas, wherein said argon gas has a flow in the range of approximately 300–500 sccm;
   a nitrogen gas, wherein said nitrogen gas has a flow in the range of approximately 70–100 sccm;
   a helium backside cooling pressure in the range of approximately 10–17 Torr; and
   an electrode temperature in the range of approximately 0.1–20° C.

12. A method for forming trenches in a substrate of a semiconductor device consisting of:
   performing a first etch step using a carbon-fluorine base etchant, wherein said first etch step begins etching an etch hard mask and an oxide layer, wherein said etch hard mask is above said oxide layer, and wherein said first etch step forms a polymer layer on the exposed surfaces of said etch hard mask and said oxide layer;
   performing a second etch step using a carbon-fluorine base etchant, wherein said second etch step removes said polymer layer from the horizontal surfaces of said semiconductor device and completes the etching of said etch hard mask and said oxide layer; and
   performing a third etch step using a non carbon-fluorine base etchant, wherein said third etch step etches said substrate.

13. The method as described in claim 12 wherein said substrate is selected from the group consisting of silicon and polysilicon.

14. The method as described in claim 12 wherein said etch hard mask comprises silicon nitride.

15. The method as described in claim 12 wherein said first, second, and third etch steps are performed in a low density parallel plate etch reactor.

16. The method as described in claim 12 wherein said first and second etch steps form a polymer protectant on the sidewalls of said trench being formed in said etch hard mask and said oxide layer during said first and second etch steps.

17. The method as described in claim 12 wherein said carbon-fluorine base etchant of said first etch step comprises a $C_2F_6$:He gas.

18. The method as described in claim 12 wherein said carbon-fluorine base etchant of said second etch step comprises a $CF_4$ gas.

19. The method as described in claim 17 wherein said $C_2F_6$:He gas is delivered at a gas flow ratio in the range of approximately 0.1:1–8:, respectively.

20. The method as described in claim 18 wherein said $CF_4$ gas is delivered at a gas flow in the range of approximately 70–100 sccm.

21. The method as described in claim 18 wherein said first etch step is performed at:
   a forward power of approximately 300–1000 watts;
   an RF frequency in the range of approximately 200 kHz–13.56 MHz;
   a pressure in the range of approximately 300–700 mTorr;
   a gap spacing in the range of approximately 0.6–1.0 cm; and
   an electrode temperature in the range of approximately 0.1–20° C.

22. The method as described in claim 20 wherein said second etch step is performed with:
   a forward power of approximately 1000–1900 watts;
   an RF frequency in the range of approximately 200 kHz–13.56 MHz;
   a pressure in the range of approximately 300–700 mTorr;
   a gap spacing in the range of approximately 1–1.2 cm;
   an argon gas, wherein said argon gas has a flow in the range of approximately 300–500 sccm;
   a nitrogen gas, wherein said nitrogen gas has a flow in the range of approximately 70–100 sccm;
   a helium backside cooling pressure in the range of approximately 10–17 Torr; and
   an electrode temperature in the range of approximately 0.1–20° C.

23. A method for forming trenches in a semiconductor device comprising:
   providing a substrate;
   depositing an oxide layer above said substrate;
   depositing a silicon nitride layer above said oxide layer;
   depositing a photoresist above said silicon nitride layer;
   patterning said photoresist;
   performing a first etch step using a carbon-fluorine base etchant, wherein said first etch step begins etching said silicon nitride layer and said oxide layer, and wherein said first etch step forms a polymer layer on the exposed surfaces of said silicon nitride layer and said oxide layer;

performing a second etch step using a carbon-fluorine base etchant in a low density parallel plate etch reactor having a high forward power, wherein said second etch step removes said polymer layer from the horizontal surfaces of said semiconductor device and completes the etching of said silicon nitride layer and said oxide layer; and performing a third etch step using a non carbon-fluorine base etchant, wherein said third etch step etches said substrate.

24. The method as described in claim 23 wherein said substrate is selected from the group consisting of silicon and polysilicon.

25. The method as described in claim 23 wherein said first and third etch steps are performed in a low density parallel plate etch reactor.

26. The method as described in claim 23 wherein said high forward power of said second etch step causes ion bombardment which removes polymer from the horizontal surfaces of said semiconductor device.

27. The method as described in claim 23 wherein said first and second etch steps form a polymer protectant on the sidewalls of said trench being formed in said polish stop layer and said oxide layer during said first and second etch steps.

28. The method as described in claim 23 wherein said carbon-fluorine base etchant of said first etch step comprises a $C_2F_6$:He gas.

29. The method as described in claim 26 wherein said carbon-fluorine base etchant of said second etch step comprises a $CF_4$ gas.

30. The method as described in claim 28 wherein said $C_2F_6$:He gas is delivered at a gas flow ratio in the range of approximately 0.1:1–8:1, respectively.

31. The method as described in claim 29 wherein said $CF_4$ gas is delivered at a gas flow in the range of approximately 70–100 sccm.

32. The method as described in claim 30 wherein said first etch step is performed at:

a forward power of approximately 300–1000 watts;

an RF frequency in the range of approximately 200 kHz–13.56 MHz;

a pressure in the range of approximately 300–700 mTorr;

a gap spacing in the range of approximately 0.6–1.0 cm; and an electrode temperature in the range of approximately 0.1–20° C.

33. The method as described in claim 31 wherein said second etch step is performed with:

a forward power of approximately 1000–1900 watts;

an RF frequency in the range of approximately 200 kHz–13.56 MHz;

a pressure in the range of approximately 300–700 mTorr;

a gap spacing in the range of approximately 1–1.2 cm;

an argon gas, wherein said argon gas has a flow in the range of approximately 300–500 sccm;

a nitrogen gas, wherein said nitrogen gas has a flow in the range of approximately 70–100 sccm;

a helium backside cooling pressure in the range of approximately 10–17 Torr; and an electrode temperature in the range of approximately 0.1–20° C.

* * * * *